US012807033B2

(12) United States Patent
Zhu et al.

(10) Patent No.: US 12,807,033 B2
(45) Date of Patent: Nov. 24, 2026

(54) OPERATIONAL VOLTAGE LIMITATIONS FOR BATTERIES

(71) Applicant: GM GLOBAL TECHNOLOGY OPERATIONS LLC, Detroit, MI (US)

(72) Inventors: Yongjie Zhu, Troy, MI (US); Chunhao J. Lee, Troy, MI (US); Meng Jiang, Rochester Hills, MI (US); Chen-fang Chang, Bloomfield Hills, MI (US); Sanjeev M. Naik, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 681 days.

(21) Appl. No.: 18/342,811

(22) Filed: Jun. 28, 2023

(65) Prior Publication Data

US 2025/0001902 A1 Jan. 2, 2025

(51) Int. Cl.
*B60L 58/16* (2019.01)
*B60L 50/60* (2019.01)
(Continued)

(52) U.S. Cl.
CPC ............... *B60L 58/16* (2019.02); *B60L 50/60* (2019.02); *G01R 31/367* (2019.01); *G01R 31/392* (2019.01); *H01M 10/425* (2013.01); *H01M 10/482* (2013.01); *B60L 2240/545* (2013.01); *B60L 2240/547* (2013.01); *H01M 2010/4271* (2013.01); *H01M 2220/20* (2013.01)

(58) Field of Classification Search
CPC ....... B60L 58/16; B60L 50/60; G01R 31/392; G01R 31/367; H01M 10/425; H01M 10/482
See application file for complete search history.

(56) References Cited

U.S. PATENT DOCUMENTS

2019/0111800 A1* 4/2019 Remboski .......... G01R 31/3648

FOREIGN PATENT DOCUMENTS

| | | | | |
|---|---|---|---|---|
| DE | 102019213125 A1 * | 3/2021 | ............ | H01M 10/48 |
| WO | WO-2021118118 A1 * | 6/2021 | ......... | G01R 31/3835 |
| WO | WO-2022024885 A1 * | 2/2022 | ............. | B60L 58/12 |

OTHER PUBLICATIONS

DE_102019213125 English Translation (Year: 2019).*
(Continued)

*Primary Examiner* — Jimmy Vo
(74) *Attorney, Agent, or Firm* — CANTOR COLBURN LLP

(57) ABSTRACT

Aspects of the disclosure include a battery management system that actively limits the operational voltage of a cell to avoid a cell pressure surge in response to an indicator of battery cell degradation. An exemplary battery management system can include a memory, computer readable instructions, and one or more processors that perform operations that include: measuring a first cell pressure of a cell of the battery pack at a reference voltage and measuring a second cell pressure of the cell of the battery pack at the reference voltage. A moving average of cell pressure progression is determined from the first cell pressure and the second cell pressure. Responsive to the moving average of cell pressure progression exceeding a cell pressure progression threshold, the cell of the battery pack is identified as a degraded cell and an estimate of remaining cycles for the degraded cell is determined.

20 Claims, 7 Drawing Sheets

(51) Int. Cl.

| | |
|---|---|
| ***G01R 31/367*** | (2019.01) |
| ***G01R 31/392*** | (2019.01) |
| ***H01M 10/42*** | (2006.01) |
| ***H01M 10/48*** | (2006.01) |

(56) References Cited

OTHER PUBLICATIONS

WO_2021118118 English Translation (Year: 2021).*
WO_2022024885 English Translation (Year: 2022).*
DE Office Action for Appln No. 10 2023 127 365.5 dated Apr. 3, 2024, 11 pages.

* cited by examiner

OPERATIONAL VOLTAGE LIMITATIONS FOR BATTERIES

INTRODUCTION

The subject disclosure relates to battery cell technologies, and particularly to operational voltage limitations for batteries.

High voltage electrical systems are increasingly used to power the onboard functions of both mobile and stationary systems. For example, in motor vehicles, the demand to increase fuel economy and reduce emissions has led to the development of advanced electric vehicles (EVs). EVs rely upon Rechargeable Energy Storage Systems (RESS), which typically include one or more high voltage battery packs, and an electric drivetrain to deliver power from the battery to the wheels. Battery packs can include any number of interconnected battery modules depending on the power needs of a given application. Each battery module includes a collection of conductively coupled electrochemical cells. The battery pack is configured to provide a Direct Current (DC) output voltage at a level suitable for powering a coupled electrical and/or mechanical load (e.g., an electric motor).

The capacity of a battery pack can be increased by increasing the number of modules and/or cells in the battery pack, and by increasing the number of parallel core-rolls, the number of electrode layers, and the electrode surface area within each cell of the battery pack. The battery cell chemistry also affects the overall capacity. Two common battery chemistries are the nickel-cobalt-manganese (NCM) battery and the lithium-iron-phosphate (LFP) battery.

SUMMARY

In one exemplary embodiment a vehicle includes an electric motor, a battery pack electrically coupled to the electric motor, and a battery management system coupled to the battery pack. The battery management system that actively limits the operational voltage of a cell to avoid a cell pressure surge in response to an indicator of battery cell degradation. The battery management system includes a memory, computer readable instructions, and one or more processors for executing the computer readable instructions. The computer readable instructions control the one or more processors to perform operations. The operations include measuring a first cell pressure of a cell of the battery pack at a reference voltage and measuring a second cell pressure of the cell of the battery pack at the reference voltage. A moving average of cell pressure progression is determined from the first cell pressure and the second cell pressure. Responsive to the moving average of cell pressure progression exceeding a cell pressure progression threshold, the cell of the battery pack is identified as a degraded cell and an estimate of remaining cycles for the degraded cell is determined.

In addition to one or more of the features described herein, in some embodiments, the battery management system is further configured to build a lookup table. In some embodiments, the lookup table is configured to provide, as output, an estimate of an available cycle life remaining for a battery cell. In some embodiments, the lookup table is a four dimensional (4D) lookup table that includes, as inputs, a cell voltage, a change in cycle-to-cycle cell pressure, a cell temperature, and an operational voltage window.

In some embodiments, determining the estimate of remaining cycles for the degraded cell includes inputting a first cell voltage, a first change in cycle-to-cycle cell pressure, a first cell temperature, and a first operational voltage window to the lookup table and receiving, responsive to the inputting, the estimate of remaining cycles from the lookup table.

In some embodiments, the estimate of remaining cycles for the degraded cell includes an estimate of a number of cycles until a predetermined end-of-life condition for the degraded cell. In some embodiments, the predetermined end-of-life condition includes one of a number of estimated cycles until an expected cell pressure surge above a predetermined threshold and a number of cycles until a predetermined percentage of prior cells failed.

In some embodiments, the battery management system is further configured to determine one of a charging condition and a discharging condition of the battery pack. In some embodiments, the battery management system is further configured to adjust one of a charging voltage limitation and an operational voltage limitation of the degraded cell using the lookup table.

In another exemplary embodiment a battery management system can include a memory, computer readable instructions, and one or more processors for executing the computer readable instructions. The computer readable instructions control the one or more processors to perform operations. The operations include measuring a first cell pressure of a cell of the battery pack at a reference voltage and measuring a second cell pressure of the cell of the battery pack at the reference voltage. A moving average of cell pressure progression is determined from the first cell pressure and the second cell pressure. Responsive to the moving average of cell pressure progression exceeding a cell pressure progression threshold, the cell of the battery pack is identified as a degraded cell and an estimate of remaining cycles for the degraded cell is determined.

In yet another exemplary embodiment a method for lowering a risk of cell pressure surge in a battery pack can include measuring a first cell pressure of a cell of the battery pack at a reference voltage and measuring a second cell pressure of the cell of the battery pack at the reference voltage. A moving average of cell pressure progression is determined from the first cell pressure and the second cell pressure. Responsive to the moving average of cell pressure progression exceeding a cell pressure progression threshold, the cell of the battery pack is identified as a degraded cell and an estimate of remaining cycles for the degraded cell is determined.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
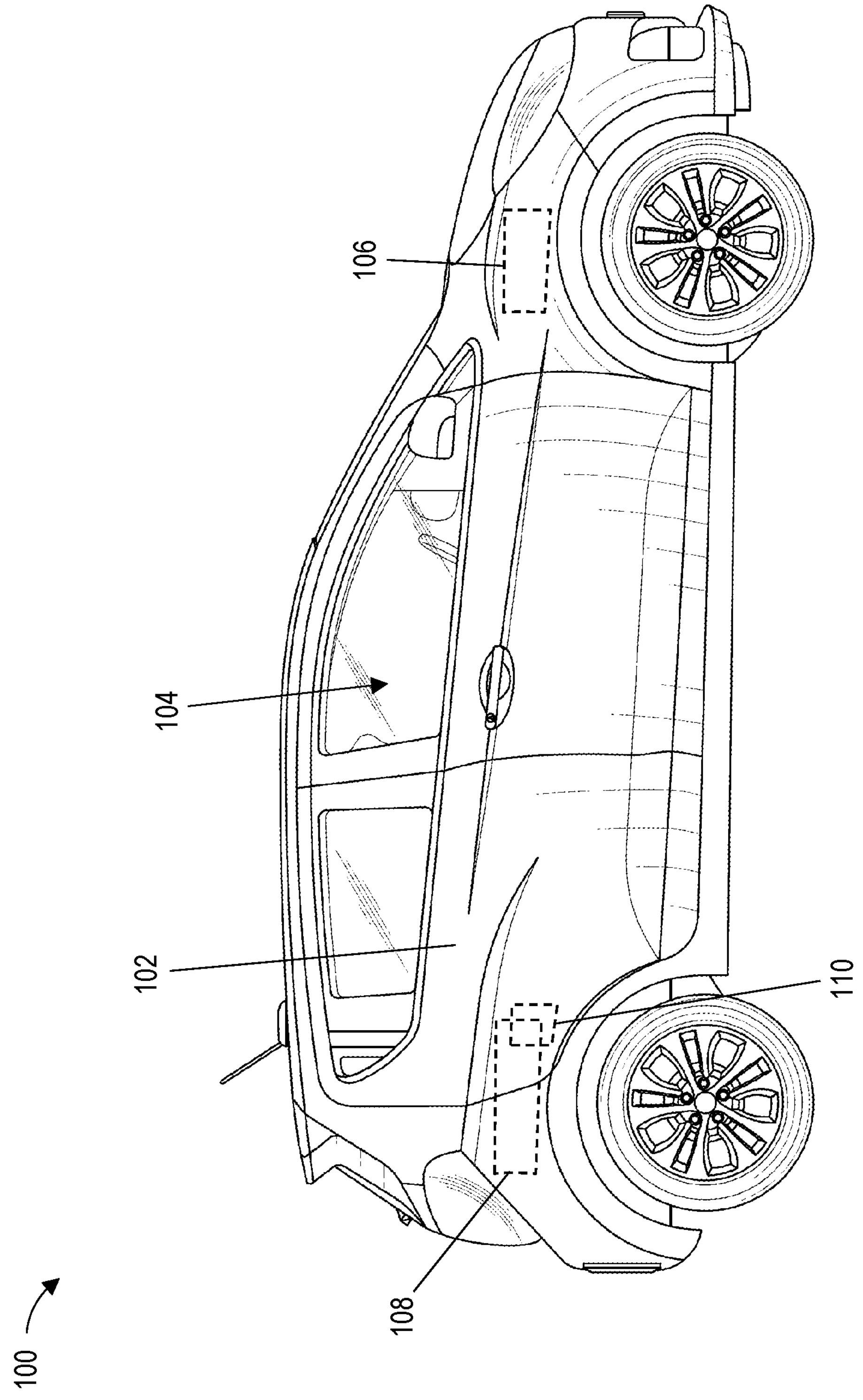
FIG. 1 is a vehicle configured in accordance with one or more embodiments.

The following description is merely exemplary in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

As discussed previously, two common battery chemistries are the nickel-cobalt-manganese (NCM) battery and the lithium-iron-phosphate (LFP) battery. While NCM and LFP batteries offer reasonable energy densities and charging/discharging profiles, other battery chemistries, including the lithium metal battery (LMB), are being pursued for next-generation battery solutions.

The main difference between lithium metal batteries and lithium-ion batteries (e.g., LFP batteries) lies in the composition and behavior of their respective anodes (negative electrodes). Lithium metal batteries use metallic lithium for the anode material. During the charging process, lithium ions from the cathode (positive electrode) are deposited onto the lithium metal anode, forming a layer of metallic lithium. This deposition process is known as lithium plating. During discharge, lithium ions are released from the anode and travel through the electrolyte to the cathode, generating an electrical current.

Lithium metal batteries offer several advantages over NCM and LFP batteries. For example, lithium metal batteries have the potential for relatively higher energy densities than NCM and LFP batteries, as the use of metallic lithium as the anode material allows for a higher theoretical specific capacity. In short, more energy can be stored per unit weight or volume in lithium metal batteries. Another advantage is a lower self-discharge rate. This means that lithium metal batteries can retain their charge for a longer duration when not in use, making them more suitable for applications where long-term storage is required. Yet another advantage is the potential for faster charging capabilities. The deposition of metallic lithium during charging can occur at high speeds, enabling rapid charge rates and reducing the charging time compared to NCM and LFP batteries.

Due to the hostless-deposition and dissolution of lithium, lithium metal batteries experience significant volume change (including swelling and shrinking) during charge and discharge. During the charging process, lithium ions are deposited onto the anode as lithium metal, causing the electrode to swell. This reversible expansion is a natural part of the lithium metal battery operation and is known as the lithium plating process. During discharge, the lithium is dissolved back into the electrolyte, resulting in shrinkage of the electrode. These volume changes can cause mechanical stresses within the cell, which may lead to electrode damage, loss of electrical connectivity, and ultimately a reduction in the overall cell performance.

In addition to a reversible expansion/contraction, lithium metal batteries also experience an irreversible cell swelling component as they age. Over time, repeated cycles of lithium deposition and dissolution can cause electrode degradation, leading to the formation of solid electrolyte interface (SEI) layers and other irreversible structural changes. These irreversible swelling phenomena are mainly caused by the gradual accumulation of side reactions, permanent dendrite formation, and the growth of lithium metal deposits in non-uniform patterns.

The reversible swelling and shrinking and irreversible expansion of lithium metal batteries pose several challenges in battery pack design. For example, cell pressure in a lithium metal battery under a fixed volume will progressively increase cycle-to-cycle due to the continuous volume expansion. Moreover, cell pressure will begin to increase relatively rapidly as the cell approaches end of life. This process, often referred to as cell pressure surge, can lead to, for example, separator breakdown, internal short circuits, and finally, capacity failure of the cell and/or battery pack.

This disclosure introduces a battery management system that actively limits the operational voltage of a cell to avoid a cell pressure surge in response to an indicator of battery cell degradation. In some embodiments, the battery management system leverages a monitored cycle-to-cycle cell pressure progression to identify cell degradation. Cell pressure progression can be a good indicator of cell degradation in lithium-based batteries and other batteries that require high pressure (e.g., greater than 1,000 kPa) for normal operation as cell pressure has been found to exhibit two successive behaviors over the life of a cell in these batteries. Initially, cell pressure increases linearly while Coulombic efficiency and cell capacity stay constant. This "linear" regime persists through the initial life of the battery (i.e., from the first cycle to the $N^{th}$ cycle), after which the cell pressure behavior transitions to an "exponential" regime. During the exponential regime, cell pressure increases exponentially between cycles and Coulombic efficiency drops significantly. Without wishing to be bound by theory, it is understood that the transition from linear to exponential behavior occurs when a lithium-based or other high pressure battery degrades beyond a certain level—specifically, after a threshold level of delta-irreversibility. In some embodiments, the battery management system detects the transition from linear to exponential behavior by monitoring the point at which cell pressure at a given voltage starts to deviate from a linear relationship. In some embodiments, cell degradation is inferred when a difference between cell pressures measured between cycles exceeds a predetermined threshold. In some embodiments, cell degradation is inferred when a moving average of the difference between cell pressures measured between cycles exceeds a predetermined threshold.

Once cell degradation has been detected (using, e.g., cycle-to-cycle cell pressure progression or otherwise), the battery management system leverages a 4-dimensional (4D) lookup table to determine an available cycle life remaining for the respective cell. In some embodiments, the battery management system limits (reduces) the operational voltage of a degraded cell based on the output from the 4D lookup table to accommodate for capacity degradation.

Limiting the operational voltage of a cell in response to cell degradation in accordance with one or more embodiments offer several technical advantages over other battery management systems. In particular, battery management systems described herein can leverage 4D lookup tables to quickly estimate a cell's available cycle life at current conditions and can act decisively to place limits on the operational voltage of the cell when the estimated available cycle life falls below targets. Limiting the operational voltage in this manner can mitigate, if not eliminate, cell pressure surge, extending the overall cycle life of a battery pack. Moreover, battery management systems described herein can leverage the estimated remaining cycle life to provide users (e.g., drivers) and systems (e.g., an ECU of a vehicle) a time window for acting prior to a battery pack capacity failure.

A vehicle, in accordance with an exemplary embodiment, is indicated generally at 100 in FIG. 1. Vehicle 100 is shown in the form of an automobile having a body 102. Body 102 includes a passenger compartment 104 within which are arranged a steering wheel, front seats, and rear passenger seats (not separately indicated). Within the body 102 are arranged a number of components, including, for example, an electric motor 106 (shown by projection under the front hood). The electric motor 106 is shown for ease of illustration and discussion only. It should be understood that the configuration, location, size, arrangement, etc., of the electric motor 106 is not meant to be particularly limited, and all such configurations (including multi-motor configurations) are within the contemplated scope of this disclosure.

The electric motor 106 is powered via a battery pack 108 (shown by projection near the rear of the vehicle 100). The battery pack 108 is shown for ease of illustration and discussion only. It should be understood that the configuration, location, size, arrangement, etc., of the battery pack 108 is not meant to be particularly limited, and all such configurations (including split configurations) are within the contemplated scope of this disclosure. Moreover, while the present disclosure is discussed primarily in the context of a battery pack 108 configured for the electric motor 106 of the vehicle 100, aspects described herein can be similarly incorporated within any system (vehicle, building, or otherwise) having an energy storage system(s) (e.g., one or more battery packs), and all such configurations and applications are within the contemplated scope of this disclosure.

As will be detailed herein, the battery pack 108 is monitored and controlled via a battery management system 110 (shown by projection near the battery pack 108). While the battery management system 110 can be included, for example, in a battery pack of an electric vehicle (e.g., the battery pack 108 of vehicle 100), other energy storage applications (for vehicles, structures, or otherwise) are within the contemplated scope of this disclosure.

Figure 2:
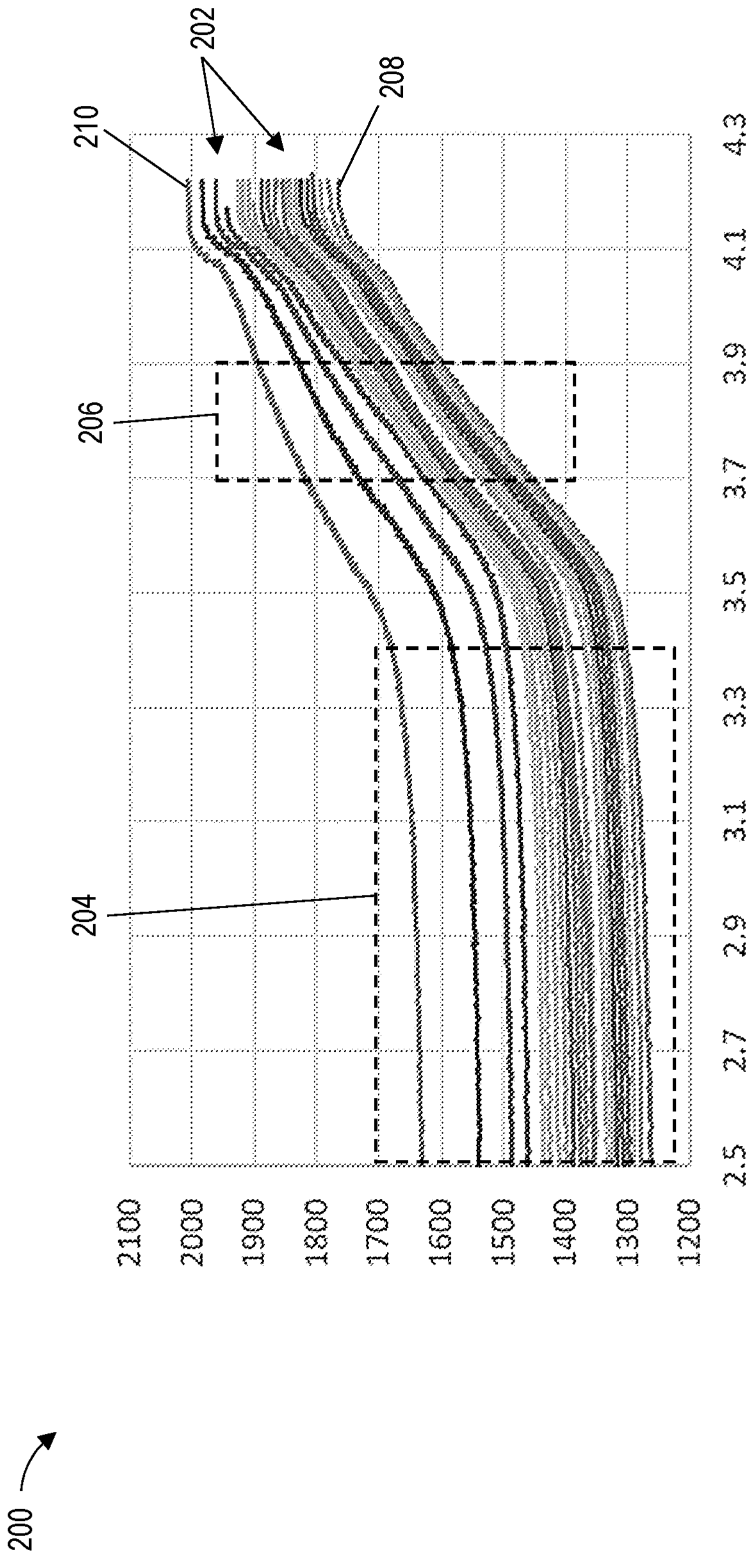
FIG. 2 is a graph depicting the relationship between cell pressure and cell voltage across a number of charge-discharge cycles in accordance with one or more embodiments.

In some embodiments, the battery management system 110 monitors cell pressure as a function of cell voltage across a number of charge-discharge cycles (refer to FIG. 2). Cell pressure can be measured using, for example, a pressure sensor(s) of the battery management system 110 (not separately shown). Alternatively, cell pressure can be measured using upstream systems, for example, using an on-board electronic control unit (ECU, not separately shown) configured to provide cell pressure measurements to the battery management system 110. In yet other embodiments, cell pressure can be estimated. Cell pressure can be estimated, for example, using physics-based or data-driven empirical models, although other techniques for cell pressure estimation are within the contemplated scope of this disclosure.

FIG. 2 illustrates a graph 200 depicting the relationship between cell pressure and cell voltage across a number of charge-discharge cycles 202 in accordance with one or more embodiments. As shown in FIG. 2, cell pressure (here, measured in kPa) increases relatively slowly while progressing from an initial cell voltage of about 2.5 volts to an intermediate cell voltage of about 3.4 volts. This relatively stable region is sometimes referred to as the high hysteresis region 204.

As further shown in FIG. 2, further increases in cell voltage beyond the high hysteresis region 204 result in a more rapid cell pressure response. Observe that, between about 3.7 and about 3.9 volts, cell pressure increases rapidly, but somewhat linearly. This region can be referred to as the measurement region 206. In some embodiments, the battery management system 110 is configured to measure, poll, or otherwise receive cell pressure measurements within the measurement region 206. In some embodiments, the battery management system 110 is configured to measure, poll, or otherwise receive cell pressure measurements at a same reference voltage across a number of charge-discharge cycles 202. In some embodiments, the reference voltage is 3.7, 3.8, or 3.9 volts, although other reference voltages (including those outside of the measurement region 206) are within the contemplated scope of this disclosure.

In some embodiments, the battery management system 110 is configured to take cell pressure measurements at a single (e.g., 3.7 volts) reference voltage across a number of charge-discharge cycles 202. In some embodiments, the battery management system 110 is configured to take cell pressure measurements at two or more reference voltages (e.g., 2.9 volts and 3.9 volts) across a number of charge-discharge cycles 202. In some embodiments, the battery management system 110 is configured to take cell pressure measurements at the reference voltage(s) when charging during one or more of the charge-discharge cycles 202. For example, a cell pressure measurement can be made when the cell voltage increases (due to charging) to 3.7 volts. In some embodiments, the battery management system 110 is configured to take cell pressure measurements at the reference voltage(s) when discharging during one or more of the charge-discharge cycles 202. For example, a cell pressure measurement can be made when the cell voltage decreases (due to driving) to 3.7 volts.

The charge-discharge cycles 202 can include a first (initial) cycle 208 and last (latest) cycle 210. Observe that cell pressure taken at a same (reference) voltage increases along the progression between the first cycle 208 and the last cycle 210. For example, the cell pressure for the first cycle 208 at 3.7 volts is approximately 1425 kPa, while the cell pressure for the last cycle 210 at 3.7 volts is approximately 1810 kPA. This relationship holds within both the high hysteresis region 204 and the measurement region 206. Observe further that the gap (delta) in cell pressures taken at the same reference voltage between successive cycles is relatively small over an initial set of the charge-discharge cycles 202, but increases rapidly as the charge-discharge cycles 202 approach the last cycle 210.

Figure 3:
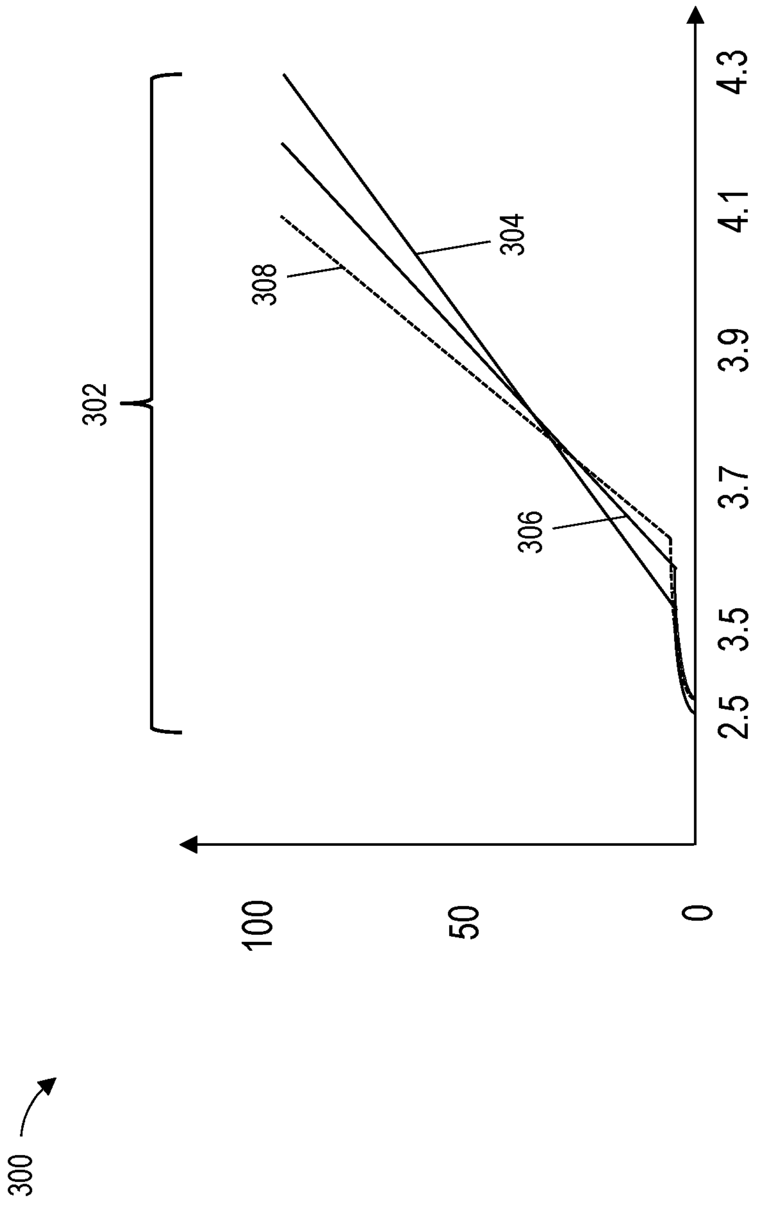
FIG. 3 is a graph depicting the relationship between state of charge and cell voltage as a cell experiences a number of charge-discharge cycles in accordance with one or more embodiments.

FIG. 3 illustrates a graph 300 depicting the relationship between state of charge (SOC, %) and cell voltage (V) as a cell experiences a number of charge-discharge cycles in accordance with one or more embodiments. As shown in FIG. 3, the operational range 302 of cell voltage between a SOC of 0 percent (an empty battery) and a SOC of 100 percent (a full battery) decrease as a cell ages. In other words, the voltage range covered by a full charge shrinks as the number of cycles increases.

To illustrate, consider three example curves 304, 306, and 308 taken, respectively, at the $(i)^{th}$, $(i+j)^{th}$, and $(i+j+k)^{th}$ cycles of the charge-discharge cycles 202, where i, j, and, k are positive constants. The three example curves 304, 306, and 308 are provided only to illustrate the relative change in the operational range 302 of cell voltage over a number of charge-discharge cycles. The exact operational range 302 for a given cell will vary depending on a number of factors such as, for example, battery chemistry, temperature (both ambient and battery pack temperature), current cycle number, battery pack capacity, SOC limits, etc. The operational range 302 for the $(i)^{th}$ cycle is the widest, ranging from a cell voltage of 2.5 volts to a cell voltage of 4.3 volts. The operational range 302 for the $(i+j)^{th}$ cycle is relatively narrower, ranging from a cell voltage of 2.5 volts to a cell voltage of 4.2 volts. The operational range 302 for the $(i+j+k)^{th}$ cycle is the narrowest, ranging from a cell voltage of 2.5 volts to a cell voltage of 4.1 volts.

Observe that, for a SOC near 100 percent (i.e., a full charge state), actual cell voltage decrease from the $(i)^{th}$ cycle to the $(i+j)^{th}$ cycle, and again decreases to the $(i+j+k)^{th}$ cycle. This decrease in cell voltage at maximum SOC represents a loss in total cell capacity (i.e., capacity degradation).

In some embodiments, the battery management system 110 is configured to lower the operational voltage of the cell and/or a battery pack (e.g., the battery pack 108) to accommodate this loss in capacity. For example, the battery management system 110 can lower the operational voltage of the cell(s) and/or battery pack from 4.3 volts to 4.2 volts at the $(i+j)^{th}$ cycle. The battery management system 110 can again lower the operational voltage of the cell(s) and/or battery pack from 4.2 volts to 4.1 volts at the $(i+j+k)^{th}$ cycle. Advantageously, lowering the operational voltage in this manner can prevent over-charging and, due to the relationship between cell pressure and cell voltage, over pressuring the degraded cell(s) and/or battery pack. The result is a decrease in cell pressure surge. Over-charging can otherwise occur when, for example, a degraded cell at the $(i+j+k)^{th}$ cycle is forced to a same maximum cell voltage (e.g., 4.3 volts) corresponding to a SOC of 100 percent for the $(i+j)^{th}$ cycle or $(i)^{th}$ cycle while, due to cell degradation, a SOC of 100 percent is actually achieved at a lower cell voltage of 4.1 volts—representing an over-charging of 0.2 volts. This degree of over-charging is illustrative only, and can be greater in practice (and will continue to increase as the number of cycles increases, due to further cell degradation).

Figure 4:
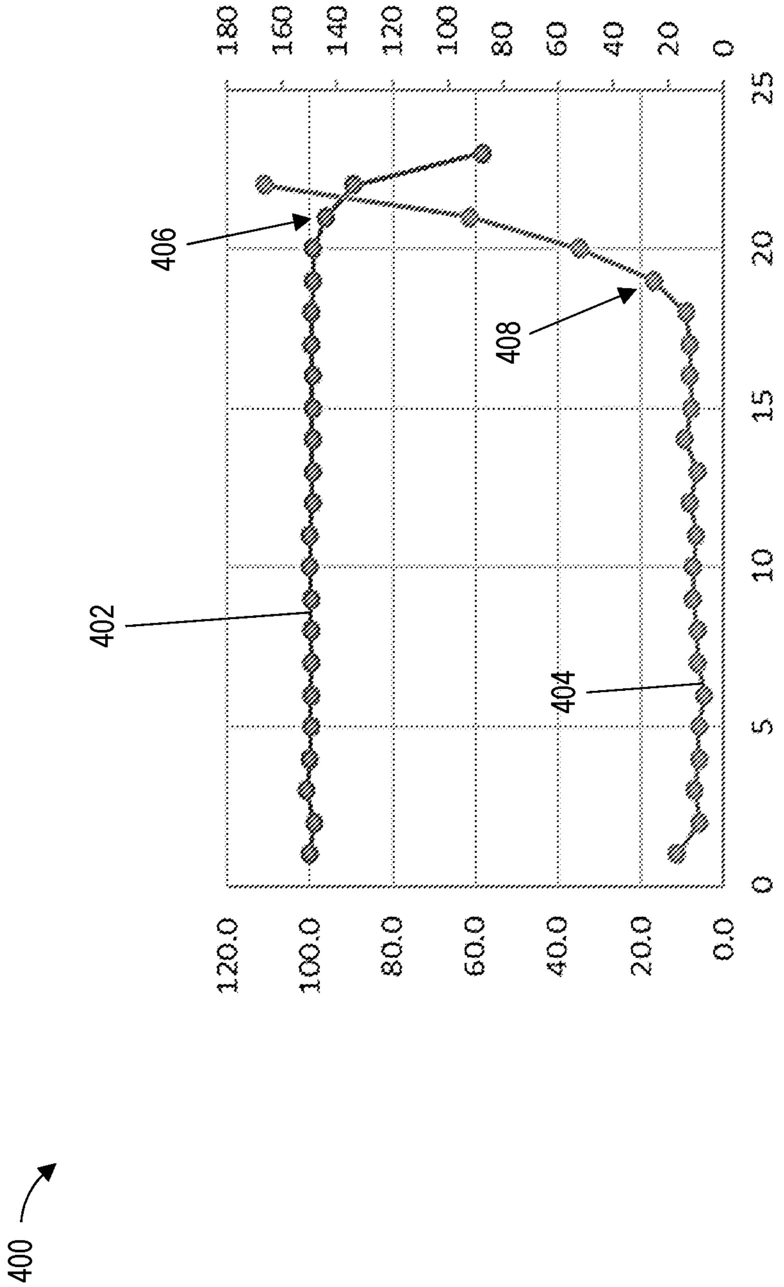
FIG. 4 is a graph depicting an example Coulombic efficiency-cycle curve and an example delta cell pressure-cycle curve in accordance with one or more embodiments.

FIG. 4 illustrates a graph 400 depicting an example Coulombic efficiency-cycle curve 402 and an example delta cell pressure-cycle curve 404 in accordance with one or more embodiments. In some embodiments, the Coulombic efficiency-cycle curve 402 is constructed by measuring Coulombic efficiency (capacity) at each cycle at a same reference voltage. In some embodiments, the reference voltage is 3.7 volts, although other reference voltages are within the contemplated scope of this disclosure. Similarly, in some embodiments, the delta cell pressure-cycle curve 404 is constructed by taking a cell pressure measurement at each cycle at a same reference voltage (refer to FIG. 2) and then determining a difference (delta) between two cell pressure measurements. The Coulombic efficiency-cycle curve 402 and the delta cell pressure-cycle curve 404 are illustrative only and will vary for a given application and conditions.

As shown in the Coulombic efficiency-cycle curve 402 of FIG. 4, efficiency (e.g., of the battery pack 108 of FIG. 1) is relatively stable until a capacity transition cycle 406 (here, the $21^{st}$ cycle). For example, deviations in cycle-to-cycle Coulombic efficiency remain within about 3 percent through the first 20 cycles. After the capacity transition cycle 406, efficiency rapidly drops. For example, at the $22^{nd}$ cycle Coulombic efficiency drops to about 90 percent. The decrease in efficiency can accelerate after the capacity transition cycle 406. For example, at the $23^{rd}$ cycle Coulombic efficiency drops from about 90 percent (at the $22^{nd}$ cycle) to about 60 percent.

As shown in the delta cell pressure-cycle curve 404 of FIG. 4, the change in cell pressure (delta CP, or $\Delta_{CP}$) between cycles remains relatively stable until a cell pressure transition cycle 408 (here, the $19^{th}$ cycle). For example, the cycle-to-cycle delta CP remains below about 20 kPa through the first 18 cycles. Observe that the capacity transition cycle 406 lags the cell pressure transition cycle 408 (here, by about 2 cycles).

The change in cell pressure can be calculated directly between any two cycles N and M according to the generalized equation (1):

$$\Delta_{CP}|_N := \frac{Pr(V_{monitor,dischg})|_N - Pr(V_{monitor,dischg})|_M}{N - M} \tag{1}$$

where Pr(.) is the measured pressure at the reference voltage and N>M (that is, N is a current cycle and M is a previous cycle).

As further shown in FIG. 4, after the cell pressure transition cycle 408, the cycle-to-cycle increases in cell pressure begin to accelerate. For example, delta CP is about 25 kPa at cycle 19, about 52 kPa at cycle 20, about 90 kPa at cycle 21, and about 165 kPa at cycle 22.

In some embodiments, the battery management system 110 identifies a degraded cell by finding a respective cell pressure transition cycle 408 in the progression of cell pressures taken over the charge-discharge cycles 202. This process can be repeated to find any number of degraded cells.

In some embodiments, the battery management system 110 compares the change (delta) in cell pressure data between cycles against a predetermined delta pressure threshold ($\Delta_C$). In some embodiments, the predetermined delta pressure threshold represents a critical (or maximum allowable) increase in cycle-to-cycle cell pressures at a reference voltage. The predetermined delta pressure threshold can vary from application to application. In some embodiments, predetermined delta pressure threshold is calibrated from cell-specific test data. In some embodiments, the battery management system 110 identifies a cell degradation condition when the measured change (delta) in cell pressure data exceeds $\Delta_C$. For example, assuming a predetermined delta pressure threshold of 20 kPa, the battery management system 110 can identify a cell degradation condition at cycle 19.

In some embodiments, the battery management system builds a lookup table configured to provide, as output, an estimate of an available cycle life remaining for a battery cell. In some embodiments, the lookup table is a calibratable 4-dimensional lookup table built empirically from prior cell data using the four inputs: (1) cell voltage (e.g., 4.0 volts), (2) change in cycle-to-cycle cell pressure (e.g., 20 kPa), (3) cell temperature (e.g., 10 degrees Celsius), and (4) the respective operational voltage window (e.g, 3.0 to 4.1 volts). In some embodiments, the battery management system configures the 4D lookup table to output, as a function of the four inputs, the available cycle life (e.g., 8 cycles remaining).

In some embodiments, the available cycle life is an estimate of the number of cycles until a predetermined end-of-life condition. The predetermined end-of-life condition can include, for example, a number of estimated cycles until an expected cell pressure surge above a predetermined threshold and/or a number of cycles until a predetermined percentage of prior similar cells failed. As used herein, a "similar" cell means a cell having a same chemistry, same capacity, same temperature, same operating conditions, same battery pack layout, etc., or such parameters within a specified tolerance (e.g., ±5 percent of the rated capacity, ±10 degrees Celsius in operational temperature, etc.).

Tables 1, 2, 3, and 4 represent example entries in a 4-dimensional lookup table using cell voltage, change in cycle-to-cycle cell pressure, cell temperature, and operational voltage window. Tables 1, 2, 3, and 4 are descriptive but are provided only to illustrate the construction of the 4D lookup tables. It should be understood that, while the 4-dimensional lookup table is shown as including the particular Tables 1, 2, 3, and 4, additional (or fewer) tables can be included. Moreover, while the particular Tables 1, 2, 3, and 4 are shown to span a specific temperature range (here, −20° C. and 50° C.) and operational voltage windows (here, 2.5 to 4.3 volts and 3.0 to 4.1 volts), a 4-dimensional lookup table can be built from any number of tables griding temperature and/or operational voltage windows at any desired resolution. For example, temperatures in the tables can span a range between −20° C. (or colder) and 50° C. (or hotter) at 1, 5, 10, etc. degree increments. Similarly, operational voltage windows in the tables can span any desired range (e.g., 3.5 to 3.9 volts, 2.0 to 5.0 volts, etc.) at any resolution/reduction (e.g., 0.01, 0.05 volts, etc., such as from 2.5-4.3 volts and 2.51-4.25 volts).

TABLE 1

| Operational Voltage Window (2.5 V to 4.3 V); Cell Temperature (−20° C.) | | | |
|---|---|---|---|
| | Voltage | | |
| $\Delta_{CP}$ | 2.5 | ... | 4.3 |
| $\Delta_{CP1}$ | 40+ | ... | 40+ |
| $\Delta_{CP2}$ | 34 | ... | 27 |
| ... | ... | ... | ... |
| $\Delta_{CPN}$ | 3 | ... | 1 |

TABLE 2

| Operational Voltage Window (2.5 V to 4.3 V); Cell Temperature (50° C.) | | | |
|---|---|---|---|
| | Voltage | | |
| $\Delta_{CP}$ | 2.5 | ... | 4.3 |
| $\Delta_{CP1}$ | 33 | ... | 31 |
| $\Delta_{CP2}$ | 22 | ... | 21 |
| ... | ... | ... | ... |
| $\Delta_{CPN}$ | 0 (WARNING) | ... | 0 (WARNING) |

TABLE 3

| Operational Voltage Window (3.0 V to 4.1 V); Cell Temperature (−20° C.) | | | |
|---|---|---|---|
| | Voltage | | |
| $\Delta_{CP}$ | 3.0 | ... | 4.1 |
| $\Delta_{CP1}$ | 30 | ... | 28 |
| $\Delta_{CP2}$ | 15 | ... | 16 |
| ... | ... | ... | ... |
| $\Delta_{CPN}$ | 0 (WARNING) | ... | 0 (WARNING) |

TABLE 4

| Operational Voltage Window (3.0 V to 4.1 V); Cell Temperature (50° C.) | | | |
|---|---|---|---|
| | Voltage | | |
| $\Delta_{CP}$ | 3.0 | ... | 4.1 |
| $\Delta_{CP1}$ | 22 | ... | 19 |
| $\Delta_{CP2}$ | 9 | ... | 5 |
| ... | ... | ... | ... |
| $\Delta_{CPN}$ | 0 (WARNING) | ... | 0 (WARNING) |

Figure 5:
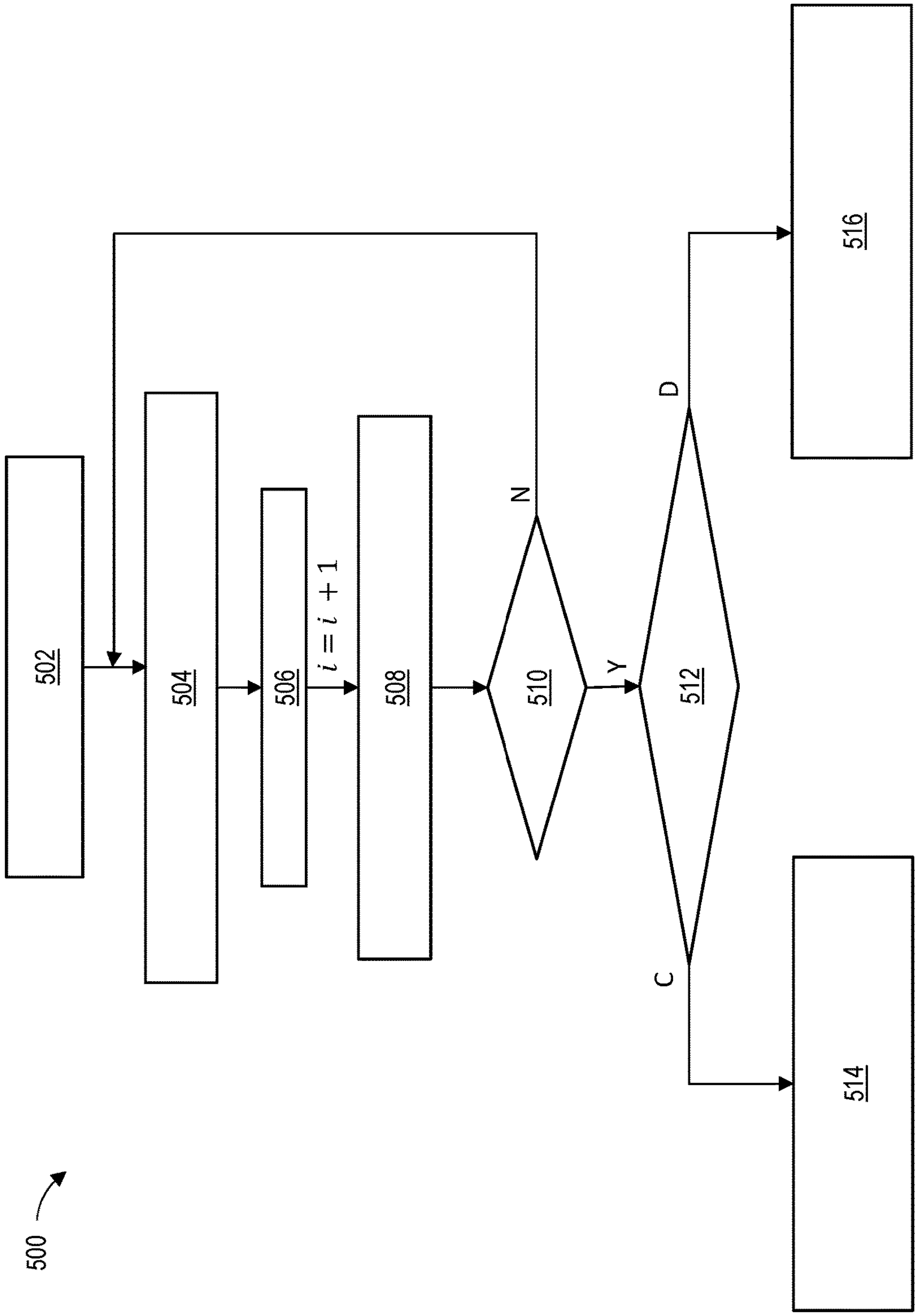
FIG. 5 is a process workflow for enforcing operational voltage limitations in response to battery cell degradation in accordance with one or more embodiments.

FIG. 5 illustrates a process workflow 500 for enforcing operational voltage limitations in response to battery cell degradation in accordance with one or more embodiments. The workflow 500 can be carried out using, for example, the battery management system 110 of the vehicle 100 (refer to FIG. 1). It should be understood that, while the process workflow 500 is largely discussed with respect to a single cell for convenience and ease of illustration, the underlying techniques can be repeated for any number of cells in a battery pack. For example, the process workflow 500 for enforcing operational voltage limitations in response to battery cell degradation in accordance with one or more embodiments can be repeated for each parallel connected cell group in a battery pack. In some embodiments, a cell (or pack, or module, etc.) failure can be decided by a respective cell in the pack, module, etc. which is predicted to have capacity failure first.

The workflow 500 begins at step 502, where cell pressure monitoring is initialized (e.g., cycle N=1), various thresholds, including, for example, $\Delta_{CP}$, $\Delta_C$, and the reference cell voltage ($V_{REF}$) are set, and an initial cell pressure measurement is made at the reference cell voltage and/or a target state of charge (e.g., 25%, 50%, 75%, SOC).

At step 504, the battery management system 110 reads and/or receives a current cell pressure $P_i$ from an $i^{th}$ cycle. In some embodiments, the battery management system 110 reads and/or receives the current cell pressure $P_i$ from the $i^{th}$ cycle at a 50% SOC. In some embodiments, the battery management system 110 proceeds to step 506 after making, retrieving, and/or recording the cell pressure measurement.

At step 506, a change in cell pressure ($\Delta_{CP}$) between the current cell pressure measurement ($P_i$) and the prior cell pressure measurement ($P_{i-1}$). In some embodiments, the battery management system 110 proceeds to step 508 after calculating the change in cell pressure. In some embodiments, the battery management system 110 increments a cycle counter (e.g., i=i+1) before proceeding to step 508.

At step 508, the battery management system 110 checks a moving average of cell pressure (i.e., a cell pressure progression) over a window of a number of cycles. In some embodiments, the battery management system 110 checks a moving average of cell pressure over a window of a predetermined number of cycles (e.g., 2 cycles, 3, cycles, 5 cycles, 10 cycles, etc.).

At step 510, the battery management system 110 determines whether the moving average of cell pressure ($\Delta_{AVG}$) is greater than (or equal to) a predetermined threshold. In some embodiments, the predetermined threshold is the predetermined delta pressure threshold ($\Delta_C$). In other words, the battery management system 110 determines whether $\Delta_{AVG} \geq \Delta_C$.

In some embodiments, the predetermined delta pressure threshold ($\Delta_C$) is a static, predetermined threshold. In some embodiments, the predetermined delta pressure threshold ($\Delta_C$) is a dynamic variable. In some embodiments, the predetermined delta pressure threshold ($\Delta_C$) is a function of the current moving average of cell pressure ($\Delta_{AVG}$). For example, the predetermined delta pressure threshold ($\Delta_C$) can be calculated as 101 percent, 105 percent, 110 percent, 115 percent, 150 percent, etc., of the current moving average of cell pressure ($\Delta_{AVG}$). In some embodiments, the predetermined delta pressure threshold ($\Delta_C$) can be calculated as (1+m %) of the current moving average of cell pressure ($\Delta_{AVG}$), where "m" is a function of the cell chemistry and design of a particular application. In some embodiments, "m" is a learned value from empirical data of prior failed cells.

In some embodiments, if $\Delta_{AVG} < \Delta_C$ (i.e., NO), the battery management system 110 can indicate that the change in cell pressure between cycles remains below the critical cell pressure threshold and the process can return to step 504. In some embodiments, if $\Delta_{AVG} \geq \Delta_C$ (i.e., YES), the battery management system 110 can indicate that the change in cell pressure between cycles has exceeded the critical cell pressure threshold (i.e., indicating cell degradation of the respective cell) and the process can proceed to step 512. In some embodiments, when cell degradation is detected in one or more cells of a battery pack, the battery management system 110 can take one or more of a plurality of actions to mitigate the issue and to ensure the safe and optimal operation of the battery pack.

At step 512, the battery management system 110 determines whether the cell and/or vehicle (e.g., the vehicle 100 of FIG. 1) is in a charge or discharge state. In some embodiments, the battery management system 110 responds to cell degradation depending on the charge/discharge status of the cell. If the cell and/or vehicle is in a charge state (i.e., "C"), the process proceeds to step 514. If the cell and/or vehicle is in a discharge state (i.e., "D"), the process proceeds to step 516.

At block 514 (during a charge state), the battery management system 110 indicates to a user (e.g., driver) and/or external system (e.g., a vehicle ECU) that the respective battery cell has degraded. In some embodiments, the battery management system 110 raises (flags) a capacity failure warning for the respective cell. In some embodiments, the battery management system 110 reports, to the user and/or external system an estimated number of remaining life cycles for the respective cell using a calibratable lookup table (refer to Tables 1 to 4). In some embodiments, the battery management system 110 inputs, to the calibratable, the current cell voltage, change in cycle-to-cycle cell pressure, cell temperature, and operational voltage window and receives, as output, the respective estimated number of remaining life cycles.

In some embodiments, the battery management system 110 leverages the calibratable lookup table to set new charging voltage limitations (i.e., a new SOC window) for the cell, a battery module including the cell, and/or a battery pack including a battery module including the cell. For example, the battery management system 110 can limit cell voltage while charging to adjust the SOC window to 10% (or more or less) to 90% (or more or less) of the original SOC window.

In some embodiments, the new charging voltage limitations are selected from the calibratable lookup table to avoid an estimated cell pressure surge within a predetermined number of cycles. For example, if cell pressure surge is predicted within the next cycle (or 2, 3, etc.), a new charging voltage limitation can be selected that extends the cell pressure surge prediction by 5 cycles (or 3, 4, 8, 12, etc.). In some embodiments, the battery management system 110 reports to the user and/or external system the number of estimated cycles available at the new charging voltage limitation prior to an expected cell pressure surge (cell failure). In short, the number of estimated cycles available at the new charging voltage limitation serve as an additional time window for a user (e.g., driver or system) to act prior to an expected cell and/or battery pack failure.

At block 516 (during a discharge state), the battery management system 110 indicates to a user (e.g., driver) and/or external system (e.g., a vehicle ECU) that the respective battery cell has degraded. In some embodiments, the battery management system 110 raises (flags) a capacity failure warning for the respective cell. In some embodiments, the battery management system 110 reports, to the user and/or external system an estimated number of remaining life cycles for the respective cell using a calibratable lookup table (refer to Tables 1 to 4). In some embodiments, the battery management system 110 inputs, to the calibratable, the current cell voltage, change in cycle-to-cycle cell pressure, cell temperature, and operational voltage window and receives, as output, the respective estimated number of remaining life cycles.

In some embodiments, the battery management system 110 leverages the calibratable lookup table to set a new operational voltage limitation (i.e., a new SOC window) for the cell, a battery module including the cell, and/or a battery pack including a battery module including the cell. For example, the battery management system 110 can limit cell voltage while driving to adjust the SOC window to 10% (or more or less) to 90% (or more or less) of the original SOC window.

In some embodiments, the new operational voltage limitation is selected from the calibratable lookup table to avoid an estimated cell pressure surge within a predetermined number of cycles. For example, if cell pressure surge is predicted within the next cycle (or 2, 3, etc.), a new operational voltage limitation can be selected that extends the cell pressure surge prediction by 5 cycles (or 3, 4, 8, 12, etc.). In some embodiments, the battery management system 110 reports to the user and/or external system the number of estimated cycles available at the new operational voltage limitation prior to an expected cell pressure surge (cell failure). In short, the number of estimated cycles available at the new operational voltage limitation serve as an additional time window for a user (e.g., driver or system) to act prior to an expected cell and/or battery pack failure.

The particular responses described previously with respect to the charging and discharging states of respective cells are provided as examples and are not meant to be particularly limited. In some embodiments, the battery management system 110 can take one or more of a plurality of additional or alternative actions. A selection of possible responses is provided below.

Warning/Alerting: In some embodiments, the battery management system 110 issues a cell degradation warning to a user of the vehicle and/or to an internal system (e.g., the ECU) of the vehicle.

Cell balancing: In some embodiments, the battery management system 110 can initiate cell balancing to equalize a state of charge (SOC) among the cells in a battery pack. Cell balancing can minimize cell-to-cell performance variations and can mitigate the impact of cell degradation in individual cells. In some embodiments, cell balancing involves redistributing energy and/or charge between cells in a battery pack to achieve a more uniform SOC.

Current limits: In some embodiments, if a specific cell is showing signs of degradation, the battery management system 110 can limit the current going into or out of that respective cell during charging and/or discharging processes. Current can be limited, for example, between upper and lower thresholds (i.e., between 15 and 85 percent, etc.). By restricting the current, the battery management system 110 can reduce stress on the degraded cell and can minimize the rate of further cell degradation.

Temperature management: In some embodiments, the battery management system 110 can actively monitor and/or control a temperature(s) of a battery pack. In some embodiments, the battery management system 110 can adjust the charging and/or discharging currents and/or can activate passive or active cooling systems to maintain a target temperature condition in the respective cell.

Fault isolation and cell replacement: In some embodiments, the battery management system 110 can isolate the faulty cell by electrically disconnecting the cell from the system and/or battery pack. In some embodiments, the battery management system 110 can initiate a cell replacement process by identifying the degraded cell for replacement and/or by replacing the cell with a new (backup) cell.

System shutdown: In some embodiments, the battery management system 110 can initiate an automatic shutdown and/or limit the operation of the battery pack responsive to the identification of cell degradation. In some embodiments, the battery management system 110 can request another system (e.g., an ECU) to initiate an automatic shutdown responsive to the identification of cell degradation.

Figure 6:
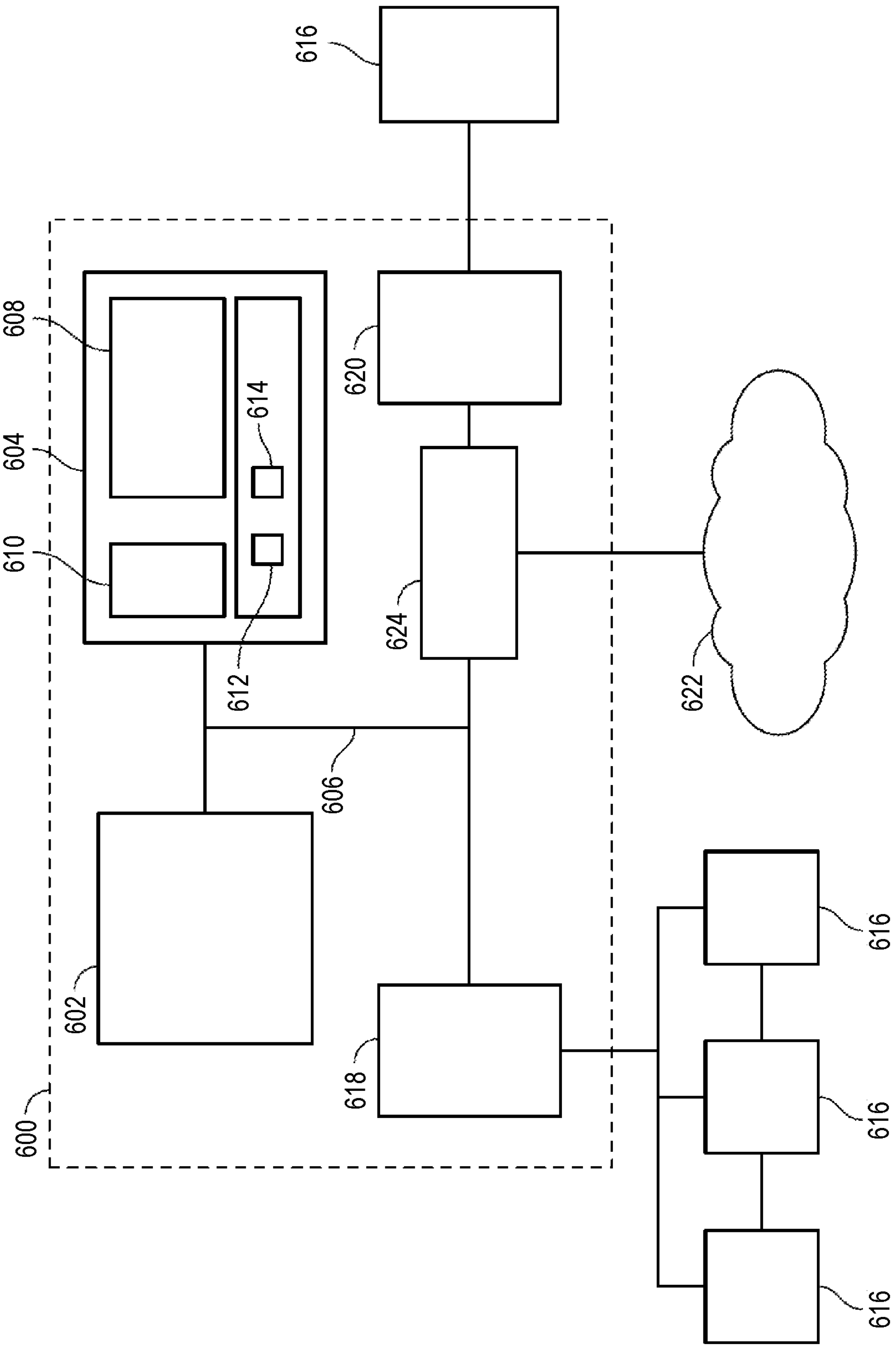
FIG. 6. is a computer system according to one or more embodiments.

FIG. 6 illustrates aspects of an embodiment of a computer system 600 that can perform various aspects of embodiments described herein. In some embodiments, the computer system 600 can be incorporated as a system (e.g., the battery management system 110 of FIG. 1) within or in combination with a battery pack (e.g., the battery pack 108 of FIG. 1). In some embodiments, the computer system 600 can be configured to receive signals (e.g., a cell pressure signal, a cell voltage signal, a state of charge signal, a temperature signal, etc.) from one or more cells of the battery pack.

The computer system 600 includes at least one processing device 602, which generally includes one or more processors for performing a variety of functions, such as, for example, controlling power delivery of an electric motor (e.g., the electric motor 106 of FIG. 1) to one or more wheels of a vehicle (e.g., the vehicle 100), controlling charge/discharge rates of one or more batteries (e.g., the battery pack 108 of FIG. 1), and/or monitoring a status (e.g., cell pressure, cell voltage) of cells of the one or more batteries. In addition, the computer system 600 can include the logic necessary to detect cell degradation and to take appropriate action based on the data (refer to FIG. 5).

Components of the computer system 600 include the processing device 602 (such as one or more processors or processing units), a system memory 604, and a bus 606 that couples various system components including the system memory 604 to the processing device 602. The system memory 604 may include a variety of computer system readable media. Such media can be any available media that is accessible by the processing device 602, and includes both volatile and non-volatile media, and removable and non-removable media.

For example, the system memory 604 includes a non-volatile memory 608 such as a hard drive, and may also include a volatile memory 610, such as random access memory (RAM) and/or cache memory. The computer system 600 can further include other removable/non-removable, volatile/non-volatile computer system storage media.

The system memory 604 can include at least one program product having a set (e.g., at least one) of program modules that are configured to carry out functions of the embodiments described herein. For example, the system memory 604 stores various program modules that generally carry out the functions and/or methodologies of embodiments described herein. A module or modules 612, 614 may be included to perform functions related to monitoring and/or control of the battery pack 108, such as, for example, determining one or more current cell temperatures, a current state of charge for the battery pack 108 and/or any cell of the battery pack 108, a charging duration, a charging current and/or voltage, etc. The computer system 600 is not so limited, as other modules may be included depending on the desired functionality of the vehicle 100. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality. For example, the module(s) can be configured via software, hardware, and/or firmware to stop charging and/or otherwise isolate one or more cells of a battery pack of the vehicle 100.

The processing device 602 can also be configured to communicate with one or more external devices 616 such as, for example, a keyboard, a pointing device, and/or any devices (e.g., a network card, a modem, vehicle ECUs, etc.) that enable the processing device 602 to communicate with one or more other computing devices. Communication with various devices can occur via Input/Output (I/O) interfaces 618 and 620.

The processing device 602 may also communicate with one or more networks 622 such as a local area network (LAN), a general wide area network (WAN), a bus network and/or a public network (e.g., the Internet) via a network adapter 624. In some embodiments, the network adapter 624 is or includes an optical network adaptor for communication over an optical network. It should be understood that although not shown, other hardware and/or software components may be used in conjunction with the computer system 600. Examples include, but are not limited to, microcode, device drivers, redundant processing units, external disk drive arrays, RAID systems, and data archival storage systems, etc.

Figure 7:
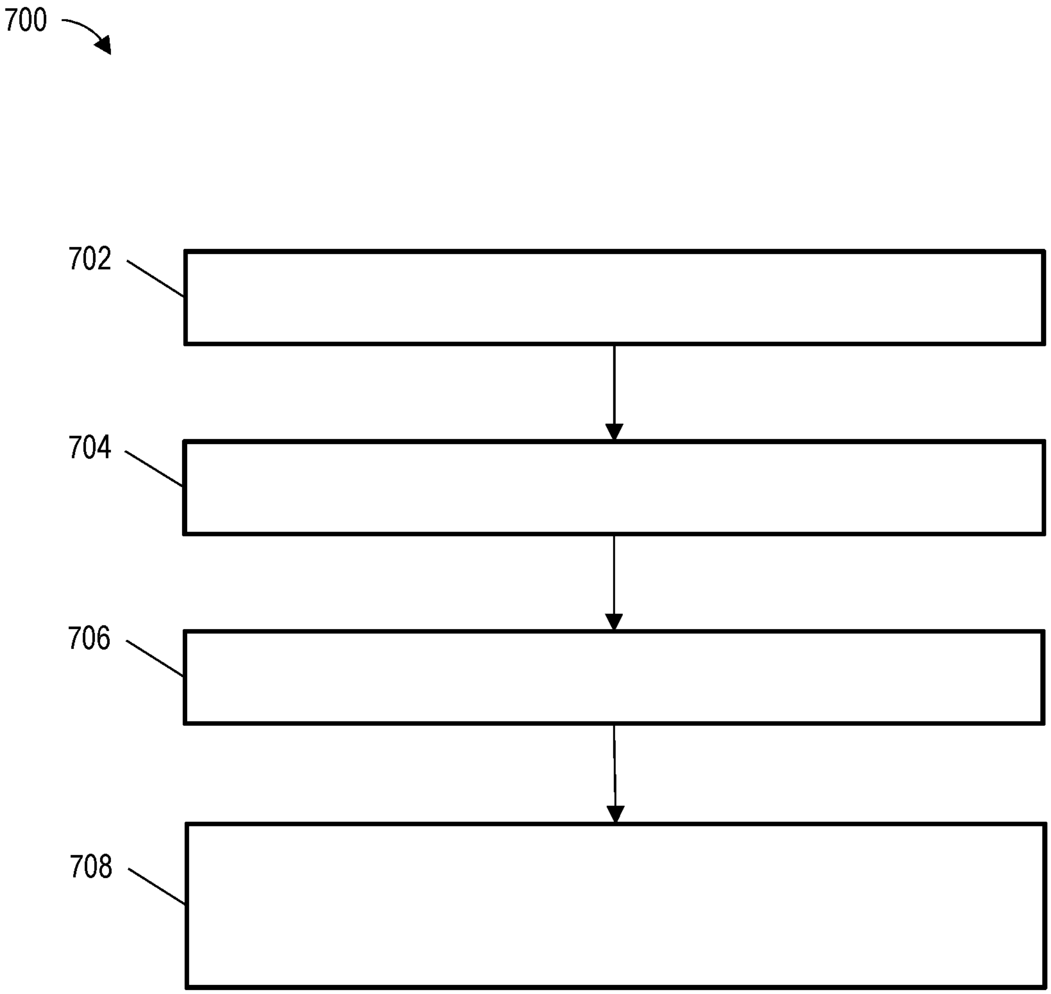
FIG. 7 is a flowchart in accordance with one or more embodiments.

Referring now to FIG. 7, a flowchart 700 for enforcing operational voltage limitations in response to battery cell degradation is generally shown according to an embodiment. The flowchart 700 is described in reference to FIGS. 1 to 6 and may include additional steps not depicted in FIG. 7. Although depicted in a particular order, the blocks depicted in FIG. 7 can be rearranged, subdivided, and/or combined.

At block 702, a first cell pressure of a cell of the battery pack is measured at a reference voltage. At block 704, a second cell pressure of the cell of the battery pack is measured at the reference voltage.

At block 706, a moving average of cell pressure progression is determined from the first cell pressure and the second cell pressure. The moving average of cell pressure progression can be determined in this manner over any desired number of cell pressure measurements.

At block 708, responsive to the moving average of cell pressure progression exceeding a cell pressure progression threshold, the cell of the battery pack is identified as a degraded cell and an estimate of remaining cycles for the degraded cell is determined.

In some embodiments, the battery management system is further configured to build a lookup table configured to provide, as output, an estimate of an available cycle life remaining for a battery cell. In some embodiments, the lookup table is a four dimensional (4D) lookup table having, as inputs, a cell voltage, a change in cycle-to-cycle cell pressure, a cell temperature, and an operational voltage window.

In some embodiments, determining the estimate of remaining cycles for the degraded cell includes inputting a first cell voltage, a first change in cycle-to-cycle cell pressure, a first cell temperature, and a first operational voltage window to the lookup table and receiving, responsive to the inputting, the estimate of remaining cycles from the lookup table.

In some embodiments, the estimate of remaining cycles for the degraded cell is an estimate of a number of cycles until a predetermined end-of-life condition for the degraded cell. In some embodiments, the predetermined end-of-life condition is one of a number of estimated cycles until an expected cell pressure surge above a predetermined threshold and a number of cycles until a predetermined percentage of prior cells failed.

In some embodiments, the battery management system is further configured to determine one of a charging condition and a discharging condition of the battery pack. In some embodiments, the battery management system is further configured to adjust one of a charging voltage limitation and an operational voltage limitation of the degraded cell using the lookup table.

The terms "a" and "an" do not denote a limitation of quantity, but rather denote the presence of at least one of the referenced items. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A vehicle comprising:

an electric motor;

a battery pack electrically coupled to the electric motor; and a battery management system coupled to the battery pack, the battery management system comprising a memory, computer readable instructions, and one or more processors for executing the computer readable instructions, the computer readable instructions controlling the one or more processors to perform operations comprising:

measuring a first cell pressure of a cell of the battery pack during a plurality of charge-discharge cycles of the battery pack, wherein the first cell pressure is measured during a first charge-discharge cycle when a cell voltage increases to a reference voltage during charging or when the cell voltage decreases to the reference voltage during discharging;

measuring a second cell pressure of the cell of the battery pack during a second charge-discharge cycle when the cell voltage increases to the reference voltage during charging or when the cell voltage decreases to the reference voltage during discharging;

determining, from at least the first cell pressure and the second cell pressure, a moving average of cell pressure progression; and responsive to the moving average of cell pressure progression exceeding a cell pressure progression threshold, identifying the cell of the battery pack as a degraded cell and determining an estimate of remaining cycles for the degraded cell.

2. The vehicle of claim 1, wherein the battery management system is further configured to build a lookup table configured to provide, as output, an estimate of an available cycle life remaining for a battery cell.

3. The vehicle of claim 2, wherein the lookup table comprises a four dimensional (4D) lookup table comprising, as inputs, a cell voltage, a change in cycle-to-cycle cell pressure, a cell temperature, and an operational voltage window.

4. The vehicle of claim 3, wherein determining the estimate of remaining cycles for the degraded cell comprises inputting a first cell voltage, a first change in cycle-to-cycle cell pressure, a first cell temperature, and a first operational voltage window to the lookup table and receiving, responsive to the inputting, the estimate of remaining cycles from the lookup table.

5. The vehicle of claim 4, wherein the estimate of remaining cycles for the degraded cell comprises an estimate of a number of cycles until a predetermined end-of-life condition for the degraded cell, wherein the predetermined end-of-life condition comprises one of a number of estimated cycles until an expected cell pressure surge above a predetermined threshold and a number of cycles until a predetermined percentage of prior cells failed.

6. The vehicle of claim 2, wherein the battery management system is further configured to determine one of a charging condition and a discharging condition of the battery pack.

7. The vehicle of claim 6, wherein the battery management system is further configured to adjust one of a charging voltage limitation and an operational voltage limitation of the degraded cell using the lookup table.

8. A battery management system comprising a memory, computer readable instructions, and one or more processors for executing the computer readable instructions, the computer readable instructions controlling the one or more processors to perform operations comprising:

measuring a first cell pressure of a cell of a battery pack during a plurality of charge-discharge cycles of the battery pack, wherein the first cell pressure is measured during a first charge-discharge cycle when a cell voltage increases to a reference voltage during charging or when the cell voltage decreases to the reference voltage during discharging;

measuring a second cell pressure of the cell of the battery pack during a second charge-discharge cycle when the cell voltage increases to the reference voltage during charging or when the cell voltage decreases to the reference voltage during discharging;

determining, from at least the first cell pressure and the second cell pressure, a moving average of cell pressure progression; and responsive to the moving average of cell pressure progression exceeding a cell pressure progression threshold, identifying the cell of the battery pack as a degraded cell and determining an estimate of remaining cycles for the degraded cell.

9. The battery management system of claim 8, wherein the battery management system is further configured to build a lookup table configured to provide, as output, an estimate of an available cycle life remaining for a battery cell.

10. The battery management system of claim 9, wherein the lookup table comprises a four dimensional (4D) lookup table comprising, as inputs, a cell voltage, a change in cycle-to-cycle cell pressure, a cell temperature, and an operational voltage window.

11. The battery management system of claim 10, wherein determining the estimate of remaining cycles for the degraded cell comprises inputting a first cell voltage, a first change in cycle-to-cycle cell pressure, a first cell temperature, and a first operational voltage window to the lookup table and receiving, responsive to the inputting, the estimate of remaining cycles from the lookup table.

12. The battery management system of claim 11, wherein the estimate of remaining cycles for the degraded cell comprises an estimate of a number of cycles until a predetermined end-of-life condition for the degraded cell, wherein the predetermined end-of-life condition comprises one of a number of estimated cycles until an expected cell pressure surge above a predetermined threshold and a number of cycles until a predetermined percentage of prior cells failed.

13. The battery management system of claim 9, wherein the battery management system is further configured to determine one of a charging condition and a discharging condition of the battery pack.

14. The battery management system of claim 13, wherein the battery management system is further configured to adjust one of a charging voltage limitation and an operational voltage limitation of the degraded cell using the lookup table.

15. A method for estimating remaining cycles for a cell in a battery pack, the method comprising:

measuring a first cell pressure of a cell of the battery pack during a plurality of charge-discharge cycles of the battery pack, wherein the first cell pressure is measured during a first charge-discharge cycle when a cell voltage increases to a reference voltage during charging or when the cell voltage decreases to the reference voltage during discharging;

measuring a second cell pressure of the cell of the battery pack during a second charge-discharge cycle when the cell voltage increases to the reference voltage during charging or when the cell voltage decreases to the reference voltage during discharging;

determining, from at least the first cell pressure and the second cell pressure, a moving average of cell pressure progression; and responsive to the moving average of cell pressure progression exceeding a cell pressure progression threshold, identifying the cell of the battery pack as a degraded cell and determining an estimate of remaining cycles for the degraded cell.

16. The method of claim 15, further comprising building a lookup table configured to provide, as output, an estimate of an available cycle life remaining for a battery cell.

17. The method of claim 16, wherein the lookup table comprises a four dimensional (4D) lookup table comprising, as inputs, a cell voltage, a change in cycle-to-cycle cell pressure, a cell temperature, and an operational voltage window.

18. The method of claim 17, wherein determining the estimate of remaining cycles for the degraded cell comprises inputting a first cell voltage, a first change in cycle-to-cycle cell pressure, a first cell temperature, and a first operational voltage window to the lookup table and receiving, responsive to the inputting, the estimate of remaining cycles from the lookup table.

19. The method of claim 18, wherein the estimate of remaining cycles for the degraded cell comprises an estimate of a number of cycles until a predetermined end-of-life condition for the degraded cell, wherein the predetermined end-of-life condition comprises one of a number of estimated cycles until an expected cell pressure surge above a predetermined threshold and a number of cycles until a predetermined percentage of prior cells failed.

20. The method of claim 16, further comprising determining one of a charging condition and a discharging condition of the battery pack.

* * * * *